United States Patent [19]
Shin

[11] Patent Number: 5,904,530
[45] Date of Patent: May 18, 1999

[54] METHOD OF MAKING LDD STRUCTURE SPACED FROM CHANNEL DOPED REGION

[75] Inventor: Hyung Soon Shin, Seoul, Rep. of Korea

[73] Assignee: Goldstar Electron Co., Ltd., Cheongju, Rep. of Korea

[21] Appl. No.: 08/873,949

[22] Filed: Jun. 12, 1997

Related U.S. Application Data

[60] Continuation of application No. 08/599,471, Jan. 23, 1996, abandoned, which is a division of application No. 08/288,135, Aug. 9, 1994, abandoned, which is a continuation of application No. 07/883,085, May 15, 1992, abandoned.

[30] Foreign Application Priority Data

May 15, 1991 [KR] Rep. of Korea .................. 7882/19911

[51] Int. Cl.⁶ ................................................ H01L 21/336
[52] U.S. Cl. ............................................ 438/291; 438/305
[58] Field of Search .................................... 438/305, 303, 438/307, 289, 291

[56] References Cited

U.S. PATENT DOCUMENTS

| | | | |
|---|---|---|---|
| 4,939,100 | 7/1990 | Jeuch et al. | 437/44 |
| 5,073,512 | 12/1991 | Yoshino | 437/41 |
| 5,082,794 | 1/1992 | Pfiester et al. | 437/40 |

FOREIGN PATENT DOCUMENTS

| | | | |
|---|---|---|---|
| 3-6863 | 1/1991 | Japan | 257/345 |

Primary Examiner—Richard A. Booth
Attorney, Agent, or Firm—Loudermilk & Associates

[57] ABSTRACT

A MOSFET and method of manufacture thereof is disclosed in which an ion implantation layer formed in the channel region is isolated from the source and drain regions. The source and drain regions are of a lightly doped drain or "LDD" structure. According to this MOSFET and method, short channel effects are decreased by the channel implant, yet hot carrier and doping compensation effects are decreased, junction capacitance is decreased, and mobility of the carriers also may be improved.

20 Claims, 3 Drawing Sheets

METHOD OF MAKING LDD STRUCTURE SPACED FROM CHANNEL DOPED REGION

This application is a continuation of application Ser. No. 08/599,471 filed on Jan. 23, 1996 now abandoned, which is a divisional of Ser. No. 08/288,135 filed on Aug. 9, 1994, now abandoned, which is a continuation of Ser. No. 07/883,085 filed May 15, 1992, now abandoned.

BACKGROUND OF THE INVENTION

1. Field of the Invention

The present invention relates to a structure of a MOSFET (metal oxide semiconductor field effect transistor) and a manufacturing method thereof, and more particularly to a MOSFET having a LDD (lightly doped drain) structure which is capable of decreasing hot carrier and doping compensation effects.

2. Description of the Prior Art

Generally, a MOSFET is a semiconductor element which is made of substantially three portions: a gate; a source region; and a drain region. A MOSFET utilizes the effect that, when a predetermined voltage is applied to the gate, a channel is produced between the source region and the drain region, and thereby electrons may be moved along the channel from the source region to the drain region (in the case of an n-channel type MOSFET).

The structure and manufacturing method and operation of the above-described conventional MOSFET will be described with reference to the FIGS. 1(a) to 2(b) as follows.

FIG. 1(a) illustrates gate 2 formed on p-type substrate 1. Gate oxide film 3 is interposed between gate 2 and substrate 1, and high density n-type source region 4 and high density n-type drain region 4a are formed in substrate 1 below the outside edge portions r1 of gate 2 as shown in FIG. 1(a).

In accordance with the operation of a thus constructed MOSFET, when a predetermined driving voltage is applied to gate 2, electrons are attracted to the surface of substrate 1 by the positive potential of gate 2, and a predetermined thickness of channel is formed between source region 4 and drain region 4a as illustrated in FIG. 1(a), and thereby electron flow may occur along this channel from source region 4 to drain region 4a.

However, in a MOSFET of the structure of FIG. 1(a), carrier concentration is abruptly decreased as illustrated in FIG. 1(b) (generally indicated by the dotted line in FIG. 1(b)) at the edge portion r1 of gate 2 (where gate 2 and drain region 4a adjoin each other) when a driving voltage is applied to gate 2, and an abrupt high electric field is formed (generally indicated by the solid line in FIG. 1(b)).

Accordingly, hot electrons may be generated at the portion of gate 2 adjoining drain region 4a, and these hot electrons may be trapped by thin gate oxide film 3. Since trapped hot electrons may recombine with positive holes collected at interface between gate oxide film 3 and gate 2, variations in the threshold voltage of the MOSFET or other undesirable effects may occur. This phenomenon is referred to as the hot carrier effect. Since the reliability of the MOSFET may be decreased due to the hot carrier effect, research is being conducted into ways for preventing its occurrence. Although increasing the length of the gate is included among the suggested approaches, increased gate length is somewhat contradictory in that it means retrogressing against the trend for high integration. Therefore, an LDD (lightly doped drain) structure as shown in FIG. 2(c) has been proposed as a method for decreasing the hot carrier effect. An LDD structure is a structure for decreasing the electric field, which exerts a great influence on the hot carrier effect near the drain region.

FIGS. 2(a), (b) and (c) illustrate cross sectional views of a manufacturing process of a MOSFET having a conventional LDD structure. As shown in FIG. 2(a), gate oxide film 6 is grown on p-type silicon substrate 5. A p-type ion implantation is performed including in what is to be the channel region in order to suppress the threshold voltage of punch through, which can occur with a short channel.

As illustrated in FIG. 2(b), polysilicon is formed on gate oxide film 6, and gate 7 is formed by patterning the polysilicon. Thereafter, low density n-type source region 9 and low density n-type drain region 10 for an LDD structure are formed by a low density n-type ion implantation using gate 7 as a mask.

As shown in FIG. 2(c), a CVD (chemical vapour deposition) oxide film is deposited and etched back, forming side wall oxide films 8 and 8a at side walls of gate 7. Thereafter, high density n-type source region 9a and high density n-type drain region 10a are formed by a high density n-type ion implantation, and thereby a MOSFET of an LDD structure is completed.

The MOSFET of such a conventional LDD structure operates as a MOSFET generally similar to that discussed in connection with FIG. 1. However, since low density n-type drain region 10 is formed between gate 7 (and the channel region below) and high density n-type drain 10a, the hot carrier effect could be decreased in that the hot carrier effect increases as the electric field increases, and the electric field is decreased in the structure shown in FIG. 2.

In other words, the lower the density of the n-type drain region against the p-type channel region, a wider depletion region is formed. On the other hand, the higher the density of the p-type channel against the n-type drain region, a narrower depletion region is formed. In the structure shown in FIG. 2, since the density of n-type drain region 10 is low, the depletion region is more widely formed, and the electric field is decreased.

However, in a MOSFET having a LDD structure as shown in FIG. 2, in order to prevent short channel effects due to the desire for high integration, a p-type ion implantation is performed in the channel region. As a result thereof, the density of the p-type channel region against the n-type drain region is higher than the density of the substrate. The increased p-type density in the channel region tends to increase the electric field, and simultaneously the hot carrier effect is increased. In addition, in order to form n-type source/drain regions adjacent to the p-type channel region, the density of n-type source/drain regions should be higher than that of the p-type channel region. However, as high integration is made, and a p-type ion implantation is performed in order to prevent the short channel effect thereby increasing the channel density, the relative difference in densities between the n-type source/drain regions against the p-type channel becomes less. As a result, a problem occurs in that a doping compensation effect arises, and the doping of the n-type source/drain regions can become unstable.

SUMMARY OF THE INVENTION

The present invention is intended to solve such problems. Accordingly, it is an object of the present invention to provide a structure of MOSFET and its manufacturing method capable of decreasing hot carrier and doping compensation effects.

In order to achieve the object described above, in accordance with the present invention, the ion implantation of the channel region for decreasing short channel effects, such as the threshold voltage of punch through, is performed only at a predetermined region within the channel region in a manner isolated from the n-type source/drain regions of low density.

DETAILED DESCRIPTION OF THE PREFERRED EMBODIMENT

The manufacturing process and structure of a MOSFET of the present invention will be described in detail with reference to the accompanying drawings of FIGS. 3(a) to (e) as follows.

Figure 1A:
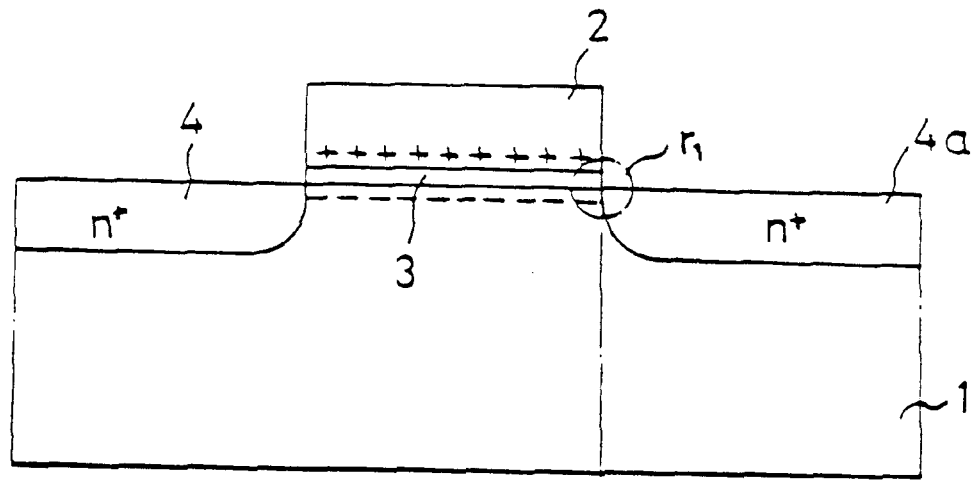
FIG. 1(a) is a cross sectional view of a structure of general MOSFET.
Figure 1B:
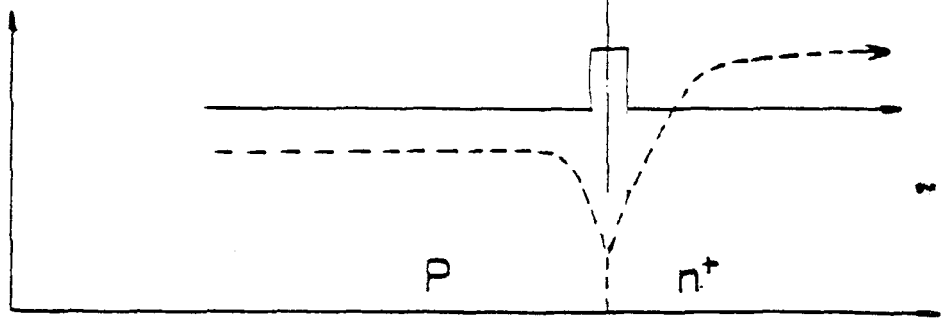
FIG. 1(b) is a diagram illustrating the carrier concentration and electric field in the structure of FIG. 1(a)
Figure 2A:
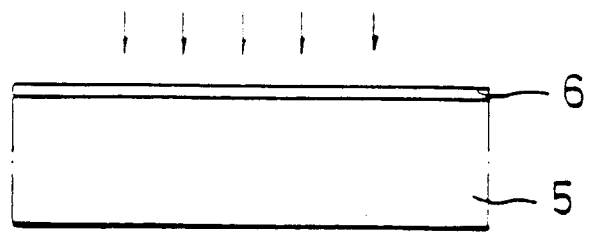
FIGS. 2(a), (b) and (c) are cross sectional views of a manufacturing process of a conventional MOSFET.
Figure 2B:
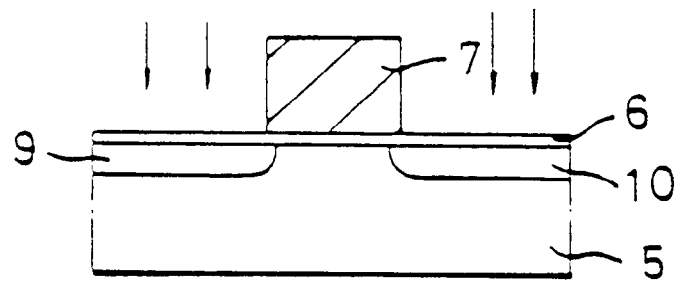
Figure 2C:
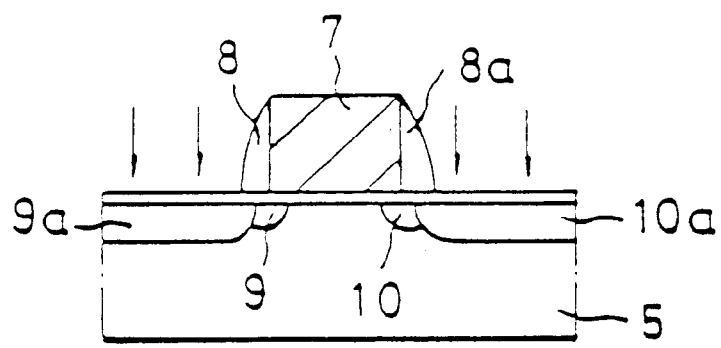
Figure 3A:
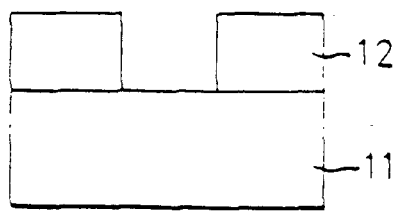
FIGS. 3(a), (b), (c), (d) and (e) are cross sectional views of a manufacturing process of a MOSFET according to a preferred embodiment of the present invention.

FIGS. 3(a)–(e) illustrate cross sectional views of a manufacturing process of a preferred embodiment of a MOSFET of the present invention. As shown in FIG. 3(a), nitride film 12 is deposited on p-type silicon substrate 11, and a portion of nitride film 12 is eliminated by a photo/etching process.

Figure 3B:
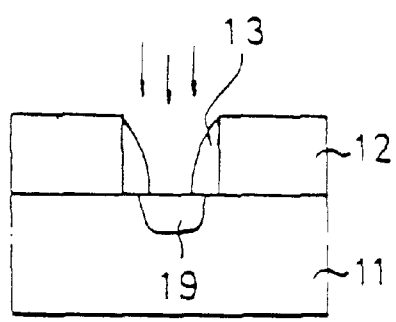

As illustrated in FIG. 3(b), an oxide film is deposited on the overall surface, and then side wall oxide film 13 is formed on the side walls of nitride film 12, portions of oxide film having been eliminated by etching back. An ion implantation of a p-type impurity is performed in a central region of the channel region for preventing short channel effects such as threshold voltage variations or punch through.

Figure 3C:
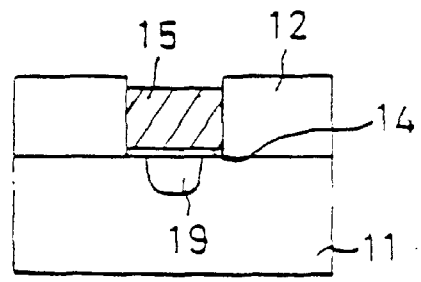

As illustrated in FIG. 3(c), side wall oxide film 13 is eliminated by etching, and then gate oxide film 14 is formed. Thereafter, a layer of polysilicon is thickly formed over the surface, and gate 15 is formed by an etch back process.

Figure 3D:
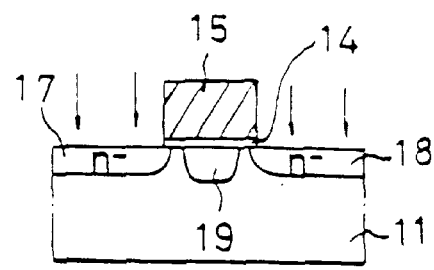

As illustrated in FIG. 3(d), nitride film 12 is eliminated by etching, and low density n-type source region 17 and low density n-type drain region 18 for an LDD structure are formed by a low density n-type ion implantation using gate 15 as a mask.

Figure 3E:
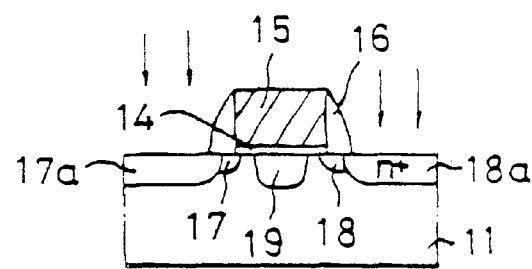

As illustrated in FIG. 3(e), an oxide film is deposited on the surface and etched back, thereby forming side wall oxide film 16 on gate 15. Thereafter, high density n-type source region 17a and high density n-type drain region 18a for an LDD structure are formed by a high density n-type ion implantation. A MOSFET according to the present invention thus is completed.

That is, a MOSFET according to the present invention has a MOSFET structure in which gate oxide film 14 and gate 15 are formed in turn on a predetermined region of the top side of p-type silicon substrate 11 as shown in FIG. 3(e), side wall oxide films 16 are formed on both side walls of gate oxide film 14 and gate 15, low density n-type source region 17 and low density n-type drain region 18 are formed on substrate 11 below side wall oxide film 16, high density n-type source region 17a and high density n-type drain region 18a are formed on the substrate below the outside edged portions of side wall oxide film 16, and p-type ion implantation layer 19 for preventing short channel effects is formed at the central portion within the channel region below gate 15 isolated from low density n-type source region 17 and low density n-type drain region 18.

With a MOSFET according to the present invention completed by the process described above, since a p-type ion implantation region for decreasing short channel effects is isolated from the low density n-type source/drain regions, there is an effect as follows.

First, as described above, since the density of the p-channel region against the n-type drain region of the same density is equal to the density of the substrate, the depletion region is more widely formed, and thereby the electric field is more decreased and simultaneously the hot carrier effect can also be decreased.

Second, since the density of the channel region is same as the density of the substrate, the relative difference of the densities between the n-type source/drain regions against the channel region becomes larger, and doping compensation effects are such that the doping of the n-type source/drain regions becomes more stable.

Third, junction capacity between the n-type source/drain regions and the channel region can be decreased.

In addition, mobility of the electrons also may be improved.

While the invention is described in connection with preferred embodiments, it will be understood that it is not intended to limit the invention to these embodiments. On the contrary, it is intended to cover all alternatives, modifications and equivalents as may be included in the spirit and scope of this invention as defined by the appended claims.

What is claimed is:

1. A method for manufacturing a MOSFET on a substrate of a first conductivity type, comprising the steps of:

forming an implant mask having an opening to the substrate, wherein the opening defines a doped region to be formed in a channel region of the substrate;

implanting ions of the first conductivity type into the substrate through the opening for forming the doped region of the first conductivity type in the channel region of the substrate, wherein at least a portion of the doped region is positioned in the channel region;

forming a gate insulating layer on the substrate, wherein at least a portion of the gate insulating layer is positioned over the channel region;

forming a gate electrode on the gate insulating layer, wherein at least a portion of the gate electrode is positioned over the channel region, wherein the gate electrode is formed subsequent to the implant for forming the doped region;

forming a source region of a second conductivity type in the substrate with a first ion implantation into the substrate, wherein the doped region in the channel region is spaced apart from the source region; and forming a drain region of the second conductivity in the substrate with the first ion implantation, wherein the channel region is defined in the substrate between at least portions of the source and drain regions, wherein the doped region in the channel region is spaced apart from the drain region.

2. The method of claim 1, wherein the first conductivity type is p-type and the second conductivity type is n-type.

3. The method of claim 1, wherein the first conductivity type is n-type and the second conductivity type is p-type.

4. The method of claim 1, wherein the opening includes a sidewall along side portions of the opening, wherein the doped region formed in the channel region is formed by ion implantation through the opening including the sidewall.

5. The method of claim 1, wherein the gate insulating layer comprises silicon dioxide.

6. The method of claim 1, further comprising the step of forming a side insulating layer substantially above the substrate along the sides of the gate electrode, wherein the side insulating layers comprise silicon dioxide.

7. The method of claim 1, wherein the gate electrode comprises polysilicon.

8. The method of claim 1, further comprising the step of forming a side insulating layer substantially above the substrate along the sides of the gate electrode.

9. The method of claim 8, wherein the side insulating layer serves as an ion implantation barrier to present the ions from being implanted in portions of the source and drain regions that are directly adjacent to the channel region.

10. The method of claim 1, wherein the drain region is of a lightly doped drain structure, wherein the concentration of the second conductivity type is lower in the portions of the drain region directly adjacent to the channel region than in portions of the drain region that are removed from the channel region.

11. The method of claim 1, wherein the source and drain regions each are of a lightly doped drain structure, wherein the concentrations of the second conductivity type in the source and drain regions are lower in the portions of the source and drain regions directly adjacent to the channel region than in portions of the source and drain regions that are removed from the channel region.

12. A method of manufacturing a semiconductor device on a substrate of a first conductivity type, comprising the steps of:

forming an implant barrier layer on a surface of the substrate;

patterning the implant barrier layer to form an opening to the substrate;

forming a first side wall insulating layer on sides of the opening;

implanting ions of the first conductivity type into the substrate through the opening, wherein the ions of the first conductivity type substantially are implanted into the substrate except beneath the first side wall insulating layer and the implant barrier layer, wherein the implant forms a doped region in the substrate defined by the opening and the first side wall insulating layer;

removing the first side wall insulating layer;

forming a gate insulating layer on the substrate in the openings of the implant barrier layer;

forming a gate layer on the gate insulating layer, wherein the gate layer is formed subsequent to the implant for forming the dope region;

removing the implant barrier layer;

implanting ions of a second conductivity type into the substrate, wherein the ions of the second conductivity type, substantially are implanted into the substrate except beneath the gate layer and are spaced apart from the doped region;

forming a second side wall insulating layer on the sides of the gate layer; and implanting ions of the second conductivity type into the substrate, wherein the ions of the second conductivity type substantially are implanted into the substrate except beneath the gate layer and the second sidewall insulating layer and are spaced apart from the doped region.

13. The method of claim 12, wherein the step of forming the first side wall insulating layer comprises the steps of:

depositing insulating material over the surface of the substrate within the opening; and etching back the insulating material to form the first side wall insulating layer.

14. The method of claim 12, wherein the implant barrier layer comprises nitride.

15. The method of claim 12, wherein the gate layer comprises polysilicon and the first and second side wall insulating layers comprise oxide.

16. The method of claim 1, wherein the doped region is spaced apart from the source region and the drain region by a region of the substrate that is of the first conductivity type and has a doped concentration less than a doping concentration of the doped region.

17. The method of claim 12, wherein the doped region is spaced apart from regions where the ions of the second conductivity type are implanted by a region of the substrate that is of the first conductivity type and has a doping concentration that is less than a doping concentration of the doped region.

18. A method of manufacturing an MOSFET on a substrate of a first conductivity type, comprising the steps of:

forming an implant barrier layer on the substrate;

patterning the implant barrier layer to form an opening to the substrate;

forming a first side wall insulating layer on sides of the opening in the implant barrier layer;

implanting ions of the first conductivity type into the substrate through the opening, wherein the first side wall insulating layer and the barrier layer serve as an implant mask, wherein the implant forms a doped region in the substrate;

removing the first side wall insulating layer;

forming a gate insulating layer on the substrate in the opening of the implant barrier layer;

forming a gate layer on the gate insulating layer, wherein the gate layer is formed subsequent to the implant for forming the doped region;

removing the implant barrier layer;

implanting ions of a second conductivity type into the substrate except a portion beneath the gate layer, wherein the implanted ions are spaced apart from the doped region;

forming a second side wall insulating layer at sides of the gate layer; and implanting ions of the second conductivity type into the substrate, wherein the ions of the second conductivity type substantially are implanted into the substrate except beneath the gate layer and the second side wall insulating layer, wherein the implanted ions are spaced apart from the doped region.

19. The method of claim 18, wherein the gate insulating layer comprises silicon dioxide and the gate layer comprises polysilicon.

20. The method of claim 18, wherein the implant barrier layer comprises nitride.

* * * * *